United States Patent [19]

Iwanaga et al.

[11] 4,284,944
[45] Aug. 18, 1981

[54] BATTERY CHARGING DEVICE HAVING BATTERY STATE INDICATING FUNCTION

[75] Inventors: Kouichi Iwanaga; Hiromi Kakumoto, both of Hikone, Japan

[73] Assignee: Matsushita Electric Works, Ltd., Osaka, Japan

[21] Appl. No.: 84,058

[22] Filed: Oct. 12, 1979

[30] Foreign Application Priority Data

Oct. 12, 1978 [JP] Japan .................. 53/125491

[51] Int. Cl.$^3$ .................. H02J 7/04; G08B 21/00
[52] U.S. Cl. .................. 320/48; 320/21; 320/39; 340/636
[58] Field of Search .................. 320/39, 40, 48, 21, 320/59; 340/636

[56] References Cited

U.S. PATENT DOCUMENTS

| 3,196,357 | 7/1965 | Hoag .................. 340/636 X |
| 3,609,502 | 9/1971 | Burkett et al. .................. 320/21 X |
| 3,736,480 | 5/1973 | Lee .................. 320/59 X |
| 4,067,000 | 1/1978 | Carlson .................. 340/636 X |

Primary Examiner—Robert J. Hickey
Attorney, Agent, or Firm—Burns, Doane, Swecker & Mathis

[57] ABSTRACT

Battery charging device having a function of indicating in sounds at least one of charging and discharging states of a storage battery, specifically adapted to be incorporated in battery operated electric implements. During charge operation, a charging circuit oscillatorily generates from a rectified direct current of commercial AC source current a high frequency charging voltage, of which oscillation becomes intermittent with varying intervals after a predetermined battery charge level is reached, whereby a charge complete detecting circuit causes a sound generating device to be operated to sound discriminatively initial and final charge complete indications responsive to the varying intervals. During discharge operation, a charge remind detecting circuit provides an output to the sound generating means only after a predetermined discharge level is reached, to cause the means device to be operated to sound a charge remind indication.

7 Claims, 9 Drawing Figures

BATTERY CHARGING DEVICE HAVING BATTERY STATE INDICATING FUNCTION

This invention relates to battery charging devices having battery state indicating function and, more particularly, improvements in the battery charging device provided in battery-operated electric implements together with a storage battery for charging the battery and indicating respective states of the battery where the charge is completed and the charge is necessary.

Generally, it is advantageous to have the battery-operated electric implements equipped with the charging device capable of letting users of the implements know respective states of the battery by indicating that the charge of the battery is complete (which shall be referred to hereinafter as "charge complete indication") and that a discharge of the battery is being completed and the charge is necessary (which shall be referred to hereinafter as "charge remind indication"), specifically in respect that, with the charge complete indication, a consumption of battery electrolyte due to any over charge and an ineffective electric power consumption can be both prevented in advance, and that, with the charge remind indication, deteriorations of electrode surfaces due to an over discharge of the battery can be prevented in advance and, if a timing of performing the charge remind indication is preliminarily set to be at a time when the charge in the battery still remains to a certain extent, any inconvenience that the battery is fully discharged while the user is using the implement and the same is no longer operable can be also eliminated effectively.

In conventional devices of the kind referred to, however, the respective charge complete and charge remind indications have been exclusively relying on such light emitting means as filament bulbs, light emitting diodes and the like element for visually warning to the users the respective states of the battery. Such visual warning or light emission type indicating means are effective specifically in an event of such stationary type as the one for use with the storage battery for automobiles or even in a case of portable type where the electric implement is used without being held or grasped by hand so long as the user's sight is normal so that the respective indications can be confirmed only by seeing the light emitted.

However, these devices still involve such problems that, specifically in such implement as an electric dry shaver which is used as directly grasped by hand, the light emission type indicating means is hard to see if the means is provided at a position of the shaver to be covered, for example, by hand, so that the position at which the indicating means may be provided must be restricted, and that, even when the means is not making the charge remind indication immediately before use, it is necessary to often interrupt the use in order to confirm by seeing the means whether the charge remind indication is made or not during the use.

Futher, in an event where either or both of the charge complete and charge remind indications is to be made at a preliminarily set timing, a use of the implement after the particular timing involved such inconvenience in practical use that a recognition by the user of the advancing extent of the charge or discharge after the timing is difficult to mate when only depending on the lighting of the light emitting means which has been unlit at the particular timing, or the turning off of the means which has been lit so that the user requires himself to memorize the amount of used electricity after the charge complete or charge remind indication by converting it to a time elapsed after the indication. In order to eliminate such inconvenience, it may be possible to have the light emitting means intermittenly turned and off with a varying on time or off interval depending on the advancing extent of the charge or discharge but, even with this measure, the indication cannot be effectively recognized so long as the light emitting means is out of the sight of the user.

The present invention has been suggested in view of these inconveniences in the conventional battery charging devices of the kind referred to.

A primary object of the present invention is, therefore, to provide a battery charging device having a battery state indicating function wherein the function is performed by means of a sound generation.

Another object of the present invention is to provide the battery charging device which is capable of discriminately indicating by sounds respective extents of charging or discharging state of a battery associated with an electric implement.

Still another object of the present invention is to provide a battery charging device capable of indicating by sounds the charging or discharging state of the battery with economical circuit structure.

Other objects and advantages of the present invention will be made clear upon reading the following description of the invention detailed with reference to preferred embodiments thereof shown in accompanying drawings, in which.

Figure 1:
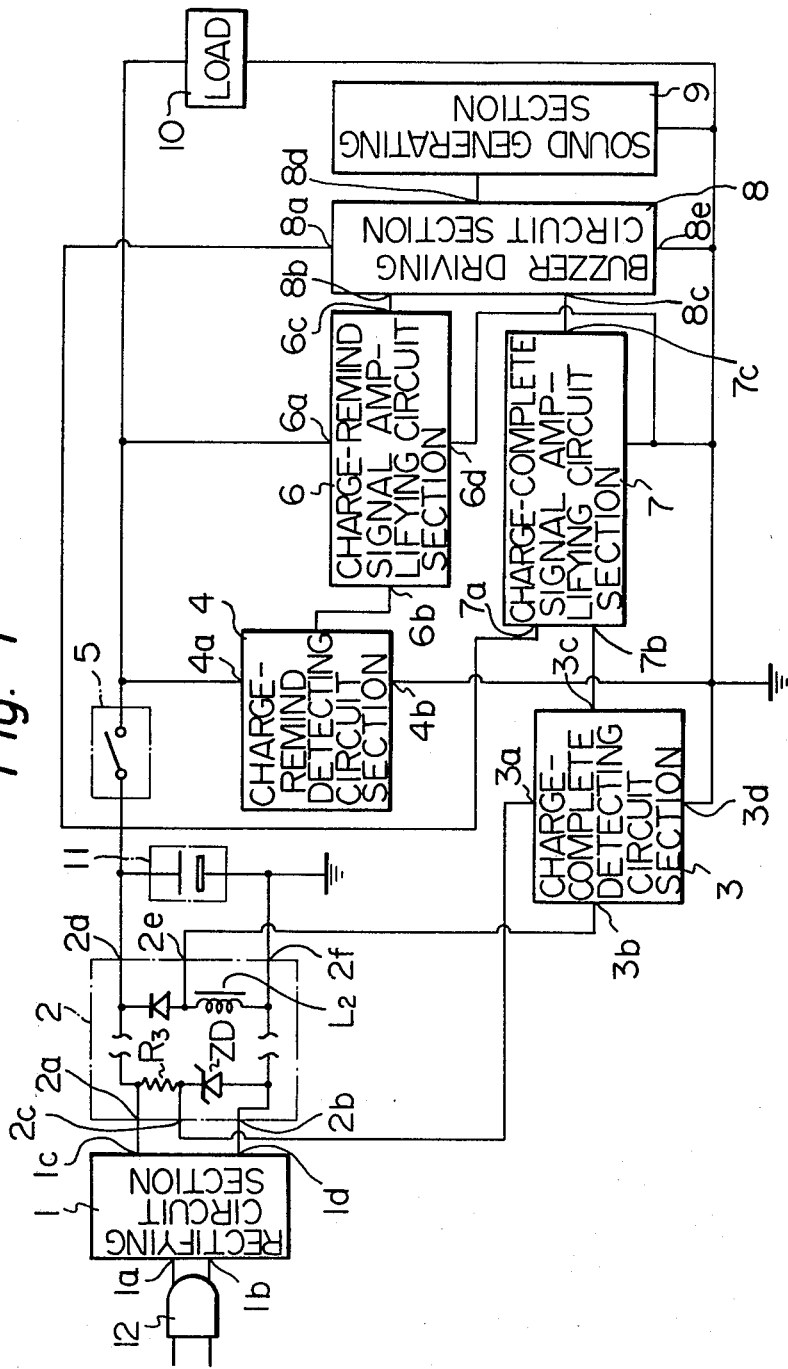
FIG. 1 shows in a block diagram an embodiment of the present invention which is adapted to perform both of the charge complete indication and the charge remind indication.

Referring now to FIG. 1 showing in a block circuit diagram an embodiment of the device according to the present invention which includes a storage battery and load, a rectifying circuit section 1 converts a commerical alternating current fed through a plug 12 of the device to a direct current. That is, the alternating current applied to terminals 1a and 1b of the section 1 is converted to a direct current, and an output is provided to terminals $1c$ and $1d$ of the secton 1 to be fed to input terminals $2a$ and $2b$ of a charging circuit section 2 in the next stage. In the charging circuit section 2, the direct current voltage applied to the input terminal $2a$ and $2b$ is reduced to a voltage most suitable for charging an associated storage battery 11 and is fed to the battery through terminals $2d$ and $2f$ of the section 2. In other terminals $2e$ and $2c$ of the section 2, the terminal $2e$ for providing a signal output is connected to an output winding $L_2$ provided in the section 2 for generating a charging voltage so as to provide a frequency signal depending on the process of the battery charging, while the terminal $2c$ divides and reduces the direct current voltage applied to the input terminals $2a$ and $2b$ by means of a resistance $R_3$ and constant voltage element ZD, and these terminals $2c$ and $2e$ are connected respectively to a voltage holding terminal $3a$ and to an input terminal $3b$ of a charge complete detecting circuit section 3 which is a circuit to detect the charge completion out of frequency signals from the charging circuit section 2. The detected signal of the charge complete detecting circuit section 3 is provided through its output terminal $3c$ and to a signal input terminal $7b$ of a charge complete signal amplifying circuit section 7, in which section 7 an amplifying element is operated upon receiving the input of the detected signal of the section 3, whereby a current provided from a positive terminal of the battery 11 to another terminal $7a$ of the section 7 is presented through an output terminal $7c$ to a buzzer driving circuit section 8, in which the current received through a signal input terminal $8c$ and a current provided from the positive terminal of the battery 11 through an input terminal $8a$ cause a voltage output to be intermittently oscillated and provided through output terminals $8d$ and $8e$ to a sound generating section 9 which comprises, for example, an electromagnetically or piezoelectrically operated buzzer, whereby the sound generating section 9 is driven to indicate the charge completion with a sound. A switching circuit section 5 is provided to connect the storage battery 11 to a load 10. When this switching circuit section 5 is closed, a charge remind detecting circuit section 4 and charge remind signal amplifying circuit section 6 are connected to the storage battery 11, together with the load 10. In the charge remind detecting circuit section 4, the direct current voltage across both terminals of the battery 11 and applied between input terminals $4a$ and $4b$ of the section 4 is divided by a resistance and the divided voltage is provided to a signal input terminal $6b$ of the charge remind signal amplifying circuit section 6 in which, if the voltage of the divided voltage signal applied through the signal input terminal $6b$ is above a predetermined level, an amplifying element in the section 6 is operated to provide the current received through a terminal $6a$ from the positive terminal of the battery 11 to another signal input terminal $8b$ of the buzzer driving circuit section 8 through an output terminal $6c$. In the buzzer driving circuit section 8, in this case, the current received through the respective terminals $8b$ and $8a$ cause an output to be intermittently oscillated and provided at the output terminals $8d$ and $8e$, whereby the sound generating section 8 is driven to perform the charge remind indication.

Figure 2:
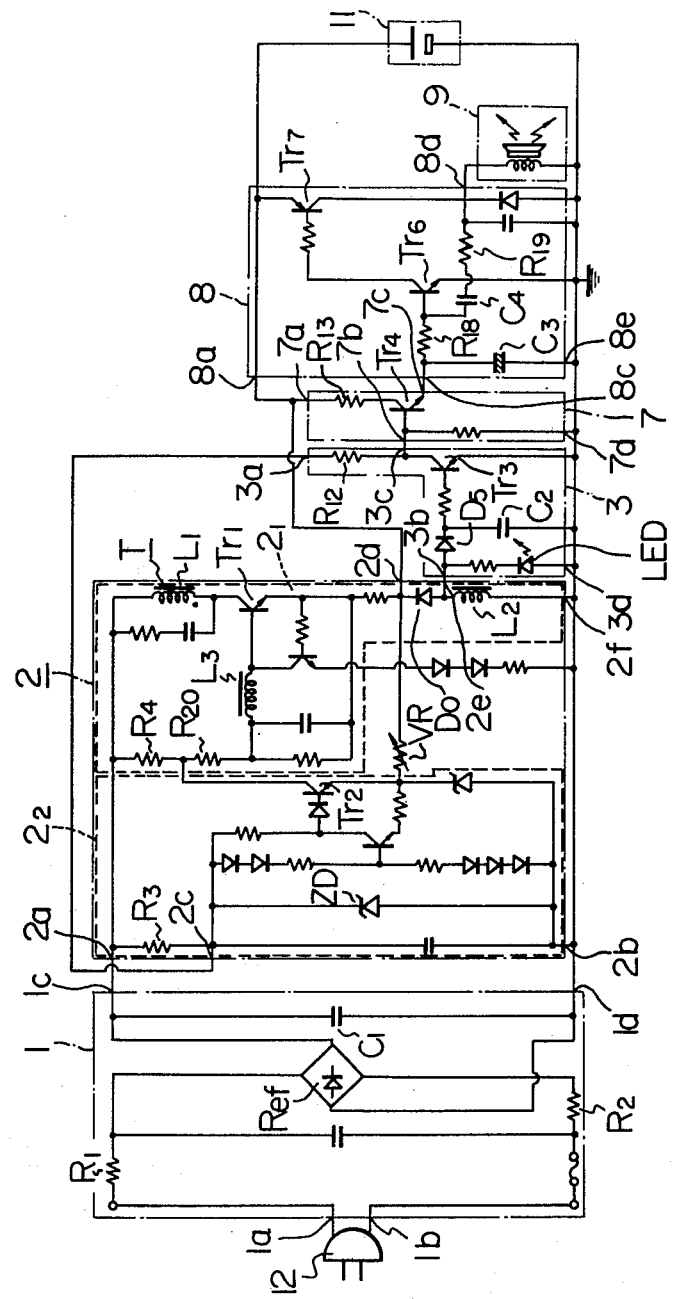
FIG. 2 is a circuit diagram showing a practical arrangement for the charge complete indication performed according to the embodiment of FIG. 1.
Figure 3A:
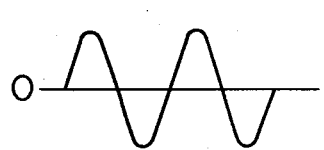
FIGS. 3A and 3B are diagrams showing wave forms respectively of input and output voltages of a rectifying circuit section in the circuit of FIG. 2.
Figure 3B:
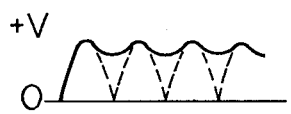
Figure 4A:
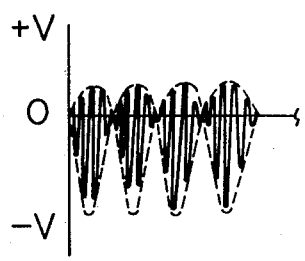
FIGS. 4A and 4B are diagrams showing wave forms respectively in the initial charging period and charge completion advance-indicating period of a voltage across an output winding of a transistor inverter in a charging circuit section of the circuit of FIG. 2.
Figure 5:
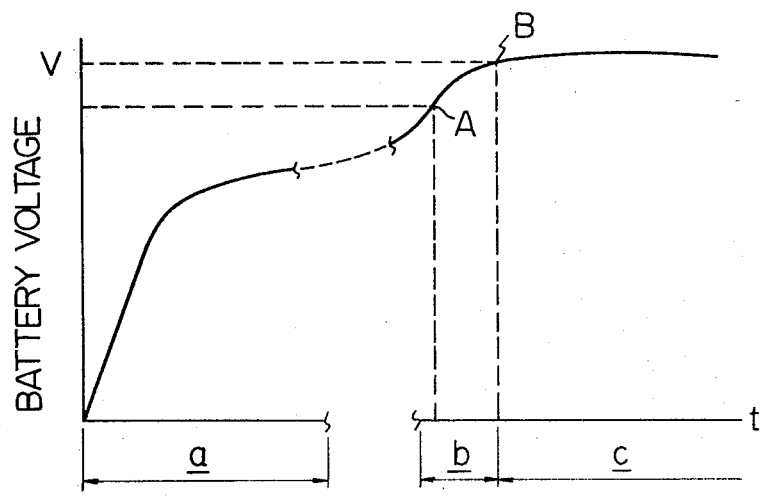
FIG. 5 is a time chart showing voltage variations in the battery being charged with the circuit of FIG. 2.
Figure 6A:
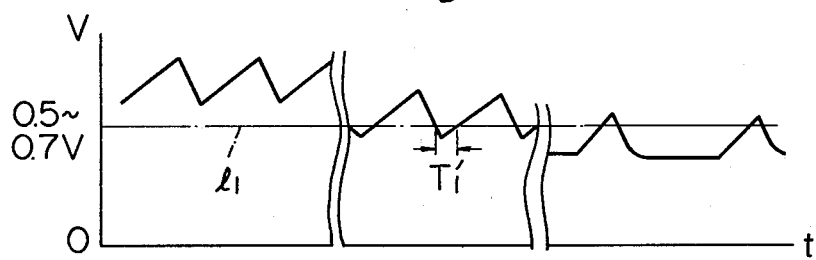
FIGS. 6a through 6D are time charts respectively for explaining operations of the charge complete indication with the circuit of FIG. 2.
Figure 6B:
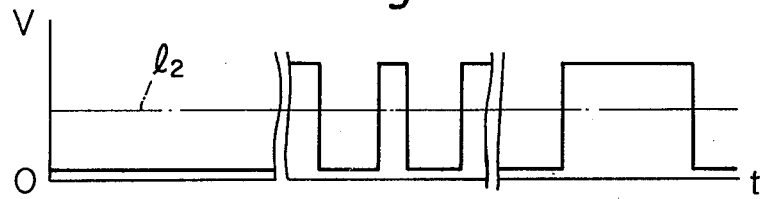

Now, the circuit arrangement as well as its operation according to the present invention specifically in the case of the charge complete indication shall be explained more in detail with reference to the practical circuit of FIG. 2. When the switching circuit 5 as in FIG. 1 is opened and the plug 12 of input lines of the device is connected to a commerical alternating current source, the circuit shown in FIG. 2 will be formed and, in the rectifying circuit section 1, the alternating current from the source is limited by means of current limiting resistances $R_1$ and $R_2$, the alternating current having a wave form of FIG. 3A is smoothed and rectified to be a direct current such as shown in FIG. 3B by a diode bridge Ref and capacitor $C_1$ and this direct current is applied to the charging circuit section 2. This charging circuit section 2 is formed of a transistor inverter $2_1$ comprising an oscillating transistor $Tr_1$, an oscillating transformer T formed of a base returned winding $L_3$, collector winding $L_1$ and output winding $L_2$ respectively wound on the same ferrite core and other elements as shown, and a charge controlling circuit $2_2$ wherein the voltage across the battery 11 connected in parallel with a series circuit of the output winding $L_2$ of the transformer T and a diode $D_0$ connected in series between an emitter of the oscillating transistor $Tr_1$ and a grounded side terminal $2f$ of the inverter $2_1$ is detected and compared with a reference voltage and, when the battery voltage becomes higher than a predetermined level, a controlling transistor $Tr_2$ is conducted and the base current of the oscillating transistor $Tr_1$ is controlled. If the voltage across the both terminals of the battery 11 is low as in an initial charging period shown by a section a in FIG. 5, the transistor inverter $2_1$ oscillates so as to charge the battery 11 with a current obtained by rectifying with the diode $D_0$ a high frequency current generated in the output winding $L_2$ and shown in FIG. 4A. Here, the high frequency current generated across both ends of the output winding $L_2$ in the initial charging period forms a frequency signal having, as its modulated waves, a frequency twice as high as a commerical frequency and, as its carrier waves, the oscillated frequency of the transistor inverter $2_1$, and this frequency signal is provided to the charge complete detecting circuit section 3 as its input. In the circuit section 3, the frequency signal is rectified by a diode $D_5$ to charge a capacitor $C_2$ as shown in an initial charging period a in FIG. 6A. If desired, a light emitting diode LED may be inserted in parallel with the capacitor $C_2$ so as to be lighted by the frequency signal before its rectification by the diode $D_5$ and, since the frequency signal is made to be high, the diode LED can be lighted as if continuously lighted so as to indicate that the battery is being charged. On the other, the capacitor $C_2$ is charged and discharged, as shown in the left-hand part of FIG. 6A, at a voltage higher than an operating level $1_1$ of about 0.5 to 0.7 V for a transistor $Tr_3$ connected at the base to the diode $D_5$ to cause the transistor $Tr_3$ to be continuously conducted, whereby the direct current divided by the resistance $R_3$ and constant voltage element ZD in the section 2 is made to flow through a resistance $R_{12}$ connected to the collector to the transistor $Tr_3$ and through the transistor $Tr_3$. Accordingly, in the initial charging period a, the charge complete detecting circuit section 3 does not provide any detecting signal at the signal output terminal $3c$ between the resistance $R_{12}$ and the transistor $Tr_3$, as shown in FIG. 6B. When the charging of the battery 11 thus advances and the voltage of the battery 11 rises to reach a level represented by point A in FIG. 5, the charging controlling circuit $2_2$ of the charging circuit section 2 will operate, the oscillating operation of the transistor inverter $2_1$ will shift from the continuous oscillation as shown in FIG.

Figure 4B:
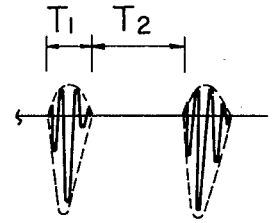
Figure 6C:
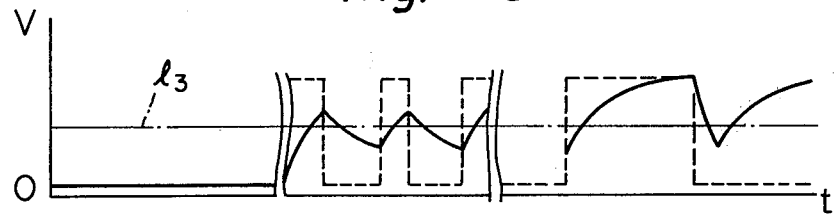
Figure 6D:
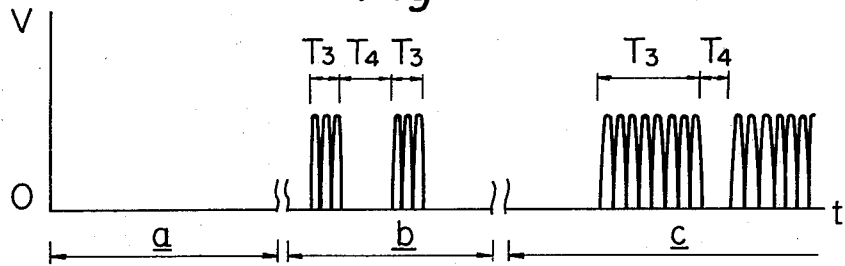

4A to an intermittent oscillation as in FIG. 4B and a pausing period $T_2$ of the oscillating operation will become longer than an operating period $T_1$ of the oscillation. Here, the charging level point A is set properly by adjusting a variable resistance VR to be a voltage corresponding, in the case of, for example, a nickel-cadmium battery, to 80 to 90% of the rated battery capacity, so that the charge complete indication can be performed in advance, after such set level. When the oscillating operation of the transistor inverter $2_1$ becomes intermittent as above, the voltage across the capacitor $C_2$ is caused to be lower than the operating level $1_1$ of the transistor $Tr_3$ in a section $T_1'$ as shown in FIG. 6A, and the charge complete detecting circuit section 3 is caused to provide, when the transistor $Tr_3$ is non-conductive, a pulse signal of a voltage higher than the operating level $1_2$ of the transistor $Tr_4$, as shown in FIG. 6B, at the output terminal $3c$. This pulse signal is utilized as a charge complete detecting signal, which is of a comparatively small pulse width, as shown in the middle of FIG. 6B, and a period in which such pulse signals are being provided is made to be a charge complete advance-indicating period b in the drawings. Now, when the charge complete detecting signal is provided into the charge complete signal amplifying circuit section 7 from the charge complete detecting circuit section 3, a transistor $Tr_4$ connected at the base to the output terminal $3c$ will be conducted, and such signals as shown in FIG. 6C will be generated at an output terminal $7c$ of the circuit section 7 during the charge complete advance-indicating period b, which signals being dependent on a time constant determined by a resistance $R_{13}$ inserted between the input terminal $7a$ and the collector of the transistor $Tr_4$, a resistance between the collector and emitter of the transistor $Tr_4$ and the capacity of a capacitor $C_3$ provided between the respective input terminals $8c$ and $8e$ of the buzzer circuit section 8. The thus generated signals include sections of a higher voltage than an operating level $1_3$ of a transistor $Tr_6$ provided in the buzzer driving circuit section 8 as shown in the middle of FIG. 6C of the advance-indicating period b. When these signals enter the buzzer driving circuit section 8 from the charge complete signal amplifying circuit section 7, the transistor $Tr_6$ and another transistor $Tr_7$ connected at the base to the collector of the transistor $Tr_6$ will be made ON and OFF to provide in ON periods of these transistors an intermittently oscillated output voltage to the sound generating section 9. In order to cause the output voltage which is dependent on a voltage discharged from the capacitor $C_3$ to rise and drop rapidly, in the present instance, the ON-operations of the transistor $Tr_6$ will be performed being dependent on a time constant determined by a resistance $R_{18}$, capacitor $C_4$, resistance $R_{19}$ and the resistance between the base and emitter of the transistor $Tr_6$ arranged as shown in FIG. 2. The intermittently oscillated output voltage thus generated and provided between the output terminal $8d$ and the ground is as shown in FIG. 6D, and the sound generating section 9 comprising a buzzer will be driven by such output voltage of the section 8 to generate a sound. This sound generating period $T_3$ lying within the advance-indicating period b will be shorter than the pausing period $T_4$, so that a few sounds closely repeated for the shorter period $T_3$ will be generated at intervals of the longer period $T_4$ as seen in the middle of FIG. 6D, during the advance-indicating period b.

Now, as the charging operation progresses and the voltage of the battery rises as shown by a point B in FIG. 5, the pausing period $T_2$ of the intermittent oscillating operation of the transistor inverter $2_1$ will become gradually longer than the operating period $T_1$ and the section in which the voltage across the capacitor $C_2$ of the charge complete detecting circuit section 3 becomes below the operating level $1_1$ of the transistor $Tr_3$ will become longer. As a result, the section in which the output voltage of the charge complete detecting circuit section 3 becomes higher than the operating level $1_2$ of the transistor $Tr_4$ will be made longer as shown in FIG. 6B, the output voltage of the charge complete signal amplifying circuit section 7 will be made higher as in FIG. 6C and the section in which the voltage is higher than the operating level $1_3$ of the transistor $Tr_6$ in the buzzer driving circuit section 8 will become much larger than the section in which it is below the operating level $1_3$. Therefore, the output period of the intermittently oscillated signal of the buzzer driving circuit section 8 will become than the nonoutput period and the operating or sound generating period $T_3$ of the sound generating section 9 will become much longer than the pausing or nonoutput period $T_4$. The entire period including such periods $T_3$ and $T_4$ will be made a charge complete final-indicating period c. With the fact that the period $T_3$ of the sound generation has become longer, the user can easily recognize that the charge of the storage battery 11 has been completed.

The battery charging device having such a charge complete indicating function as described in the foregoing according to the present invention is featured in that, in the device which generally comprises the AC source current rectifying section and the charging section for charging the storage battery with the rectified direct current from the rectifying section, the charging section is adapted to perform the charging with the high frequency output in which intervals are caused to appear after the predetermined level of the charge in the battery being charged is reached and to vary as the battery charge increases so that the completion of the charging will be detected in the charge complete detecting section depending on such varying intervals of the output for the charging, and the charge complete indication is performed by generating sounds at the sound generating section at least when the intervals appear in the charging output or depending on variations of the intervals.

For the purpose of operating the sound generating section in the manner as above, the charging section comprises a blocking type self-oscillation means of the oscillating transistor $Tr_1$ and transformer T including the respective collector, output and base return windings $L_1$ to $L_3$ as well as a battery charging voltage setting means including the variable resistance VR and its associated Zener diode shown, so that the signals for operating the sound generating section will appear initially for shorter period with longer intervals and finally for longer period with shorter intervals.

In detecting the charge completion, the charge complete detecting section is operated by an integrated output of an integrating circuit including the capacitor $C_2$ to which the charging output from the output winding $L_2$ in the charging section is applied through the rectifying diode $D_5$.

Further, the charge complete detecting section includes a switching circuit including the transistor $Tr_3$ of which an ON/OFF interval ratio is made to vary in response to decrements in the charge of the capacitor $C_2$ or increments in the charge of the battery, so that the operating mode of the buzzer driving section will be varied depending on the varying ON/OFF interval ratio of the transistor $Tr_3$, whereby the extent of the battery charge is discriminatively indicated by sounds differently generated.

Figure 7:
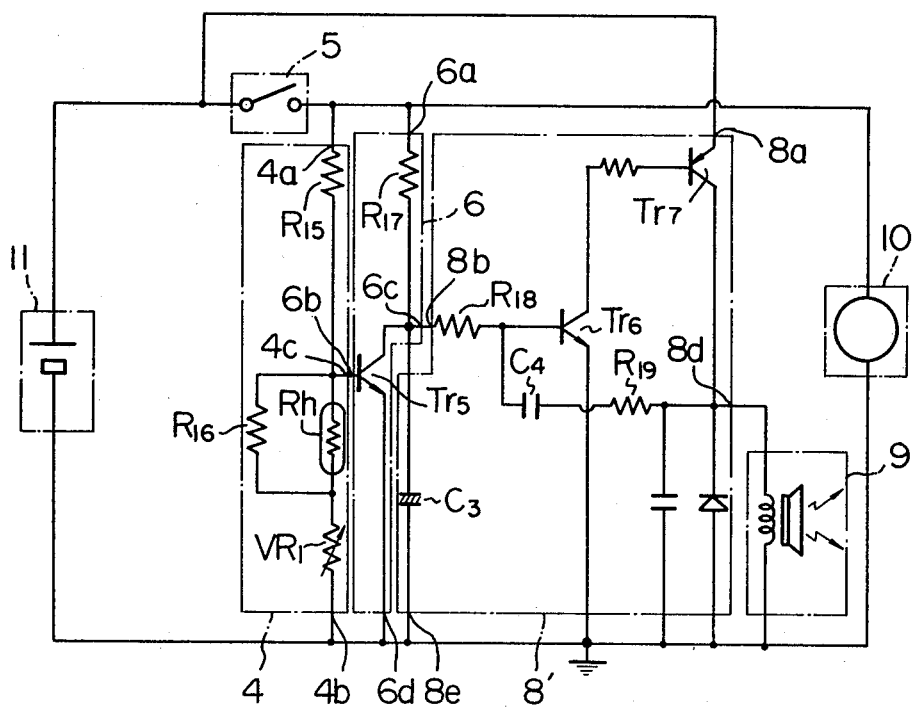
FIG. 7 is a circuit diagram showing a practical arrangement for the charge remind indication performed in accordance with the embodiment of FIG. 1.
Figure 8:
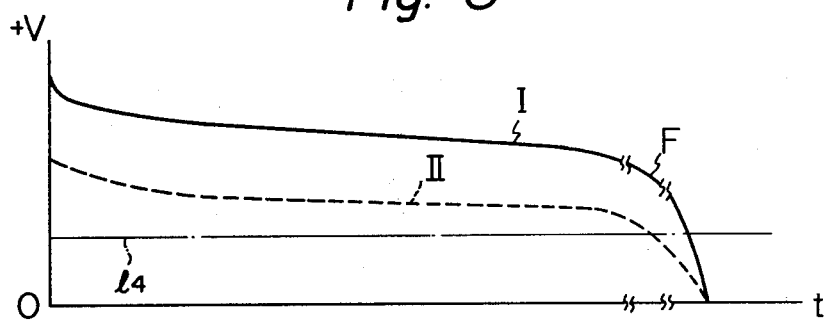
FIG. 8 is a time chart showing voltage variations in the battery being discharged with the circuit of FIG. 7.

Next, the circuit arrangement and its operation of the present invention for the charge remind indication shall be referred to with reference to the practical circuit of FIG. 7 and explanatory diagrams of FIGS. 8 and 9.

Figure 9A:
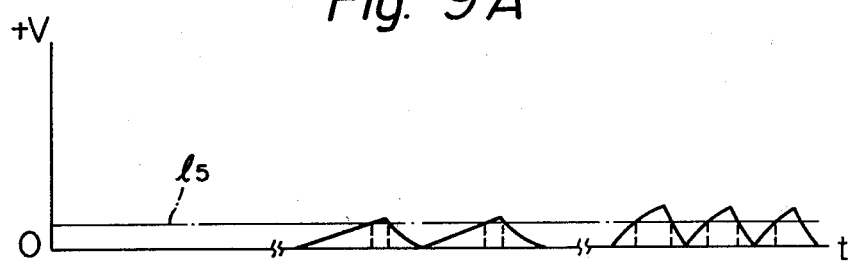
FIGS. 9A and 9B are time charts for explaining operations of the charge remind indication with the circuit of FIG. 7.
Figure 9B:
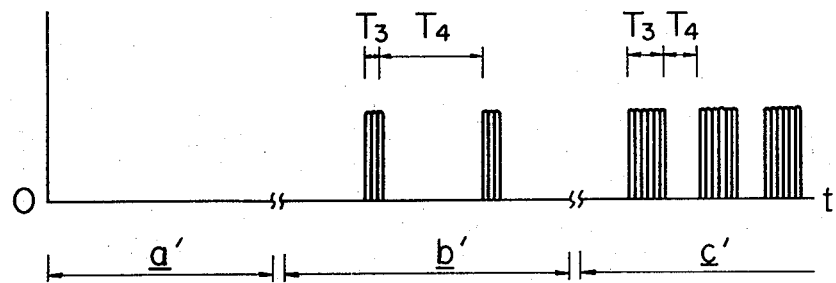

In driving the load 10 such as a motor of the electric shaver with the fully charged battery 11, the plug 12 is disconnected from the commercial alternating current source and the switching circuit section 5 is closed, whereby such a circuit for the charge remind indication as shown in FIG. 7 is formed. The load 10 is connected to the battery 11 through the switching circuit section 5 to be operated by the power fed from the battery. On the other hand, the charge remind detecting section 4 comprising a series circuit of a resistance $R_{15}$, parallel circuit of a resistance $R_{16}$ and thermister Rh and variable resistor $VR_1$ is connected in parallel to the battery 11, so that the voltage across the section 4 is divided. The divided voltage is supplied to the charge remind signal amplifying circuit 6, wherein the voltage is applied to the base of a transistor $Tr_5$ in the charge remind signal amplifying circuit section 6. In this charge remind signal amplifying circuit section 6, a series circuit of a resistance $R_{17}$ and transistor $Tr_5$ is connected to the battery 11 through the switching circuit section 5. Now when the voltage of the battery 11 as shown by a curve I in FIG. 8 is high to be in an initial normal load using period a' as in FIG. 9B in which the voltage across the output terminals 4b and 4c of the section 4 as represented by a curve II in FIG. 8 is higher than the operating level $1_4$ of the transistor $Tr_5$, the transistor $Tr_5$ will be ON and no detecting signal will be provided at the output terminal 6c as shown in FIG. 9A. Therefore, no output signal will be generated at the output terminal 8d of the buzzer driving circuit section 8 and the sound generating section 9 will not be operated. When the capacity of the battery 11 reduces with the use of the load 10 and the voltage of the battery 11 reduces to reach a point F at which the output voltage of the charge remind detecting circuit section 4 becomes below the operating level $1_4$ of the transistor $Tr_5$, the transistor $Tr_5$ will be switched OFF and a charging current will be made to flow into the capacitor $C_3$ connected between the input terminals 8b and 8e of the buzzer driving circuit section 8 through the resistance $R_{17}$ from the battery 11 to charge the capacitor $C_3$. When the voltage across the capacitor $C_3$ becomes higher than an operating level $1_5$ of a transistor $Tr_6$ accompanied by a transistor $Tr_7$, these transistors will be switched ON and the driving current will be made to flow from the battery 11 to the sound generating section 9 connected between the output terminal 8d and 8e of the buzzer driving circuit section 8 through the transistor $Tr_7$. Here, upon the conduction of the transistor $Tr_6$, the current oscillated to flow to the sound generating section 9 depending on the time constant determined by a resistance $R_{18}$, capacitor $C_4$, resistance $R_{19}$ and the resistance between the base and emitter in the transistor $Tr_6$ will be of such wave form as shown in FIG. 9B. In case the voltage of the battery 11 is on a comparatively high level, the period in which the voltage across the capacitor $C_3$ exceeds the operating level $1_5$ of the transistor $Tr_6$ will be short as shown in FIG. 9A, and the output period of the output signal of the buzzer driving circuit section 8, that is, the sound generating period $T_3$ of the sound generating section 9 will become shorter than the pausing period $T_4$. This period is made a charge remind indicating period II as shown in FIG. 9B. When the voltage of the battery 11 gradually reduces and the period in which the voltage across the capacitor $C_3$ exceeds the operating level $1_5$ of the transistor $Tr_6$ becomes longer than the period in which the voltage does not exceed the operating level $1_5$, the sound generating period $T_3$ of the sound generating section 9 will become longer than the pausing period $T_4$. This period is a discharge completing period III shown in FIG. 9B. Here, by the sound generation of the sound generating section 9, the user can recognize the reduction of the capacity of the battery 11 and, by the length of the sound generating period $T_3$, the remaining capacity can be also recognized.

With the arrangement as has been described, according to the present invention, there can be brought about such effects that the charge complete indication and charge remind indication can be made by sounds so that, while the conventional light indicating system cannot be effectively recognized by the user unless the light indication is within the sight of the user, the sound indications of the present invention can be well recognized even if the indications are made outside the sight of the user; particularly, even if the device of the present invention is used as assembled in such implement that has to be used as grasped by the hand of the user so that the position where the indications are made is not always in the sight of the user, such as in the case of the electric shaver, electric hair clipper, electric cauterizer, electric face beautifier or the like, the charge remind indication by means of the sounds generated can be well recognized so that the charging time will not be missed and the stop of the operation or the like during the use can be effectively prevented.

Further, there are such effects that, when a single sound generating means is used commonly for the charge complete and charge remind indications, the device as well as its assembled implement can be minimized in size and manufacturing costs can be also reduced; it is made possible due to the sound generating indications to render the respective indications of the charge completion and discharge completion as well as their respective extents to be distinctive by varying the tone of the generated sounds by modulating the current for driving the sound generating means; further, in such instrument in which only one storage battery is used to make it small and light as the electric shaver, the use of the electromagnetic buzzer as the sound generating means makes it possible to magnify an oscillatory sounds generated even with a small current by means of a proper resonating mechanism practically without any difficulty.

What is claimed is:

1. A battery charging device having a battery state indicating function comprising:
    a rectifier for converting an AC source current into a direct current;
    a high frequency charging circuit including a transistor, a transformer having windings respectively disposed in the collector, base and emitter circuits of said transistor, and a rectifying diode connected in series between said emitter circuit transformer winding and the emitter of said transistor, wherein a battery to be charged is connected in parallel with said series connected of said diode and said emitter circuit winding;

detecting means responsive to the charge level of a battery being charged, for producing an output signal when a predetermined level is reached;

a control circuit responsive to said detecting means for causing said charging circuit to produce an intermittent charging voltage when said predetermined charge level is reached; and means responsive to said level detecting means for intermittently generating a sound when said predetermined level is reached, said sound generating means being responsive to the level of charge of the battery such that the length of the period between each generated sound, relative to the length of each generated sound, is varied in dependence upon the charge level.

2. A device according to claim 1 wherein said high frequency charging circuit further includes a parallel circuit of a first capacitor and first resistance inserted between said emitter of said transistor and said transformer winding in said base circuit, a series circuit of a second capacitor and second resistance connected in parallel to said transformer winding in said collector circuit, and a series circuit of a variable resistance and Zener diode connected in parallel to a series circuit of said transformer winding in said emitter circuit and a diode, a connecting point of said variable resistance and Zener diode being connected to the transformer winding in the base circuit.

3. A device according to claim 2 wherein a series circuit of said level detecting means and said sound generating means is connected to said transformer winding in said emitter circuit.

4. A device according to claim 3 wherein said level detecting means comprises a charge completion detecting circuit including a series connected rectifying diode and capacitor connected in parallel to said transformer winding in said emitter circuit, a first transistor connected at the base and emitter to respective ends of said capacitor, and a second transistor connected at the base to the collector of said first transistor.

5. A device according to claim 4 wherein said sound generating means comprises a buzzer driving circuit including a capacitor connected to the emitter of said second transistor of said charge completion detecting circuit and a transistor connected at the base and emitter to respective ends of said capacitor, and a buzzer connected in emitter circuit of said transistor of said buzzer driving circuit.

6. A device according to claim 3 wherein said level detecting means comprises a charge completion detecting circuit inserted between said transformer winding in said emitter circuit of said charging circuit and said sound generating means, and a charge remind detecting circuit inserted through a switch means between said storage battery and said sound generating means for actuating the sound generating means only when the charge in the battery becomes below a predetermined level.

7. A device according to claim 5 wherein said level detecting means comprises a charge completion detecting circuit inserted between said transformer winding in said emitter circuit of said charging circuit and said sound generating means, and a charge remind detecting circuit having a switch means for connecting said charge remind detecting circuit between said storage battery and said buzzer driving circuit for actuating said buzzer only when the charge in the battery becomes below a predetermined level, said charge remind detecting circuit including a resistance connected in series with said capacitor in the buzzer driving circuit and with the battery through said switch means, a transistor connected in parallel to the capacitor in the buzzer driving circuit, and a variable resistance inserted between the base and the emitter of said transistor.

* * * * *